United States Patent
Carpenter et al.

(10) Patent No.: US 9,063,184 B2
(45) Date of Patent: Jun. 23, 2015

(54) NON-CONTACT CURRENT-SENSING AND VOLTAGE-SENSING CLAMP

(71) Applicant: International Business Machines Corporation, Armonk, NY (US)

(72) Inventors: Gary D. Carpenter, Austin, TX (US); Wael El-Essawy, Austin, TX (US); Alexandre Peixoto Ferreira, Austin, TX (US); Thomas Walter Keller, Austin, TX (US); Karthick Rajamani, Austin, TX (US); Juan C. Rubio, Austin, TX (US); Michael A. Schappert, Yorktown Heights, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 287 days.

(21) Appl. No.: 13/682,112

(22) Filed: Nov. 20, 2012

(65) Prior Publication Data

US 2013/0076343 A1    Mar. 28, 2013

Related U.S. Application Data

(63) Continuation-in-part of application No. 13/024,181, filed on Feb. 9, 2011, now Pat. No. 8,680,845.

(51) Int. Cl.
*G01R 35/00* (2006.01)
*G01R 19/00* (2006.01)
(Continued)

(52) U.S. Cl.
CPC ............... *G01R 33/02* (2013.01); *G01R 19/00* (2013.01); *G01R 33/09* (2013.01); *G01R 35/005* (2013.01);
(Continued)

(58) Field of Classification Search
CPC .......... H01R 43/00; G01R 33/00; G01R 1/22; G01R 19/00; G01R 21/00; G01R 15/142; G01R 15/16; G01R 15/207; G01R 33/02; G01R 33/072; G01R 33/09; G01R 33/093; G01R 35/005; H01F 27/26; H01F 15/04
USPC .................. 324/126–127, 142, 202, 244, 252
See application file for complete search history.

(56) References Cited

U.S. PATENT DOCUMENTS 4,005,380 A  *  1/1977  Heilmann et al. .......... 336/84 R
4,266,189 A       5/1981  Karlin et al.
(Continued)

FOREIGN PATENT DOCUMENTS

CN      101329370 A      12/2008
CN      201654106 U      11/2010
(Continued)

OTHER PUBLICATIONS

Office Action in U.S. Appl. No. 13/024,181 mailed on Aug. 1, 2013, 11 pages (pp. 1-11 in pdf).
(Continued)

*Primary Examiner* — Huy Q Phan
*Assistant Examiner* — Raul Rios Russo
(74) *Attorney, Agent, or Firm* — Mitch Harris, Atty at Law, LLC; Andrew M. Harris; William J. Stock

(57) ABSTRACT

A clamping current and voltage sensor provides an isolated and convenient technique for measuring current passing through a conductor such as an AC branch circuit wire, as well as providing an indication of an electrostatic potential on the wire, which can be used to indicate the phase of the voltage on the wire, and optionally a magnitude of the voltage. The device includes a body formed from two handle portions that contain the current and voltage sensors within an aperture at the distal end, which may be a ferrite cylinder with a hall effect sensor disposed in a gap along the circumference to measure current, or alternatively a winding provided through the cylinder along its axis and a capacitive plate or wire disposed adjacent to, or within, the ferrite cylinder to provide the indication of the voltage. When the handles are compressed the aperture is opened to permit insertion of a wire for measurement.

17 Claims, 5 Drawing Sheets

(51) Int. Cl.

| | |
|---|---|
| *G01R 33/09* | (2006.01) |
| *G01R 33/07* | (2006.01) |
| *G01R 1/22* | (2006.01) |
| *G01R 15/14* | (2006.01) |
| G01R 33/02 | (2006.01) |
| G01R 15/16 | (2006.01) |
| G01R 15/20 | (2006.01) |

(52) U.S. Cl.
CPC ............ *G01R 33/072* (2013.01); *G01R 33/093* (2013.01); *G01R 1/22* (2013.01); *G01R 15/142* (2013.01); *G01R 15/16* (2013.01); *G01R 15/207* (2013.01)

(56) References Cited

U.S. PATENT DOCUMENTS

| | | | |
|---|---|---|---|
| 4,378,525 A * | 3/1983 | Burdick ........................ | 324/127 |
| 4,558,276 A | 12/1985 | Comeau et al. | |
| 5,473,244 A * | 12/1995 | Libove et al. ................. | 324/126 |
| 5,610,512 A * | 3/1997 | Selcuk .......................... | 324/127 |
| 5,867,020 A | 2/1999 | Moore et al. | |
| 6,008,634 A | 12/1999 | Murofushi et al. | |
| 6,414,474 B1 | 7/2002 | Gohara et al. | |
| 6,522,509 B1 | 2/2003 | Engel et al. | |
| 6,654,219 B1 | 11/2003 | Romano et al. | |
| 6,661,239 B1 | 12/2003 | Ozick | |
| 6,703,842 B2 | 3/2004 | Itimura et al. | |
| 6,708,126 B2 | 3/2004 | Culler et al. | |
| 6,825,649 B2 | 11/2004 | Nakano | |
| 6,940,291 B1 | 9/2005 | Ozick | |
| 7,068,045 B2 | 6/2006 | Zuercher et al. | |
| 7,098,644 B1 | 8/2006 | Denison | |
| 7,148,675 B2 * | 12/2006 | Itoh ........................... | 324/117 R |
| 7,227,348 B2 | 6/2007 | Sorenson | |
| 7,230,413 B2 | 6/2007 | Zhang et al. | |
| 7,265,533 B2 | 9/2007 | Lightbody et al. | |
| 7,315,161 B2 | 1/2008 | Zribi et al. | |
| 7,330,022 B2 | 2/2008 | Bowman et al. | |
| 7,474,088 B2 | 1/2009 | Bowman et al. | |
| 7,493,222 B2 | 2/2009 | Bruno | |
| 7,546,214 B2 | 6/2009 | Rivers, Jr. et al. | |
| 7,622,912 B1 | 11/2009 | Adams et al. | |
| 7,714,594 B2 | 5/2010 | Ibuki et al. | |
| 7,719,257 B2 | 5/2010 | Robarge et al. | |
| 7,719,258 B2 | 5/2010 | Chen et al. | |
| 7,847,543 B2 | 12/2010 | Grno | |
| 7,936,164 B2 | 5/2011 | Doogue et al. | |
| 7,990,133 B2 | 8/2011 | Dockweiler | |
| 2004/0227503 A1 | 11/2004 | Bowman | |
| 2004/0257061 A1* | 12/2004 | George de Buda ....... | 324/117 R |
| 2005/0156587 A1 | 7/2005 | Yakymyshyn et al. | |
| 2006/0087777 A1 | 4/2006 | Bruno | |
| 2007/0058304 A1 | 3/2007 | Parker et al. | |
| 2008/0077336 A1 | 3/2008 | Fernandes | |
| 2008/0079437 A1 | 4/2008 | Robarge et al. | |
| 2009/0105973 A1 | 4/2009 | Choi et al. | |
| 2009/0289694 A1* | 11/2009 | Rieger et al. .................. | 327/524 |
| 2010/0001715 A1 | 1/2010 | Doogue et al. | |
| 2010/0231198 A1 | 9/2010 | Bose et al. | |
| 2010/0264944 A1 | 10/2010 | Rupert | |
| 2010/0271037 A1 | 10/2010 | Blakely | |
| 2010/0283487 A1* | 11/2010 | Juds et al. ...................... | 324/688 |
| 2011/0084688 A1 | 4/2011 | Sorensen | |
| 2012/0078545 A1* | 3/2012 | Hong et al. ..................... | 702/60 |
| 2012/0200293 A1 | 8/2012 | Carpenter et al. | |
| 2012/0319674 A1* | 12/2012 | El-Essawy et al. ............. | 324/74 |
| 2013/0099775 A1 | 4/2013 | Mitsuya | |

FOREIGN PATENT DOCUMENTS

| | | | |
|---|---|---|---|
| JP | 06174753 A | | 6/1994 |
| JP | H09281146 A | | 10/1997 |
| WO | WO2009042414 A2 | | 4/2009 |

OTHER PUBLICATIONS

U.S. Appl. No. 13/024,199, filed Feb. 9, 2011, Carpenter, et al.
U.S. Appl. No. 13/451,515, filed Apr. 19, 2012, Carpenter, et al.
U.S. Appl. No. 13/024,181, filed Feb. 9, 2011, Carpenter, et al.
U.S. Appl. No. 13/451,524, filed Apr. 19, 2012, Carpenter, et al.
U.S. Appl. No. 13/159,536, filed Jun. 14, 2012, El-Essawy, et al.
U.S. Appl. No. 13/159,554, filed Jun. 14, 2012, El-Essawy, et al.
Silicon Chip, "Compact 0-80A Automotive Ammeter", issue 165, pp. 1-12, downloaded from www.siliconchip.com.au/cms/A 03551/article.html Nov. 4, 2010, published Jun. 30, 2002.
Silicon Chip, "Current Clamp Meter Adapter for DMMs", issue 180, published Sep. 12, 2003.
Ziegler, et al., "Current Sensing Techniques: A Review", IEEE Sensors Journal, Apr. 2009, pp. 354-376 vol. 9, No. 4. Piscataway, NJ.
McKenzie, et al. "Non-contact Voltage Measurement using Electronically Varying Capacitance", Electronics Letters, Feb. 4, 2010, vol. 46, No. 3, UK.
Office Action in U.S. Appl. No. 13/451,524 mailed on Aug. 11, 2014, 18 pages (pp. 1-18 in pdf).
"AC Current sensor with Interface" downloaded from: http://www.electronicspoint.com/ac-current-sensor-interface-t221239.html on Jun. 10, 2011.
"Smart Current Signature Sensor" downloaded from http://technology.ksc.nasa.gov/successes/SS-Smart-Current-Signal-Snsr.htm on Jun. 10, 2011.
Dwyer, "A Self-Calibrating Miniature Hall Effect Solution to Gear Tooth Speed Sensing", downloaded from: http://saba.kntu.ac.ir/eecd/ecourses/instrumentation/projects/reports/speed/toothed%20rotor/toothrotor_files/main.htm on May 25, 2011.
Valuetesters.com on-line catalog: "non-contact voltage probes", downloaded from http://valuetesters.com/Voltage-Probe-Non-contact.php on May 25, 2011.
U.S. Appl. No. 13/596,658, filed Aug. 28, 2012, El-Essawy, et al.
Clarke, John, "Compact 0-80A Automotive Ammeter", Silicon Chip, issue 165, pp. 1-12, downloaded from www.siliconchip.com.au/cms/A 03551/article.html Nov. 4, 2010, published Jun. 30, 2002, 12 pages (pp. 1-12 in pdf).
Clarke, John, "Current Clamp Meter Adapter for DMMs", Silicon Chip, issue 180, published Sep. 12, 2003, 9 pages (pp. 1-9 in pdf).
McKenzie, et al. "Non-contact Voltage Measurement using Electronically Varying Capacitance", Electronics Letters, Feb. 4, 2010, 2 pages (pp. 1-2 in pdf), vol. 46, No. 3, UK.
"AC Current sensor with Interface" downloaded from: http://www.electronicspoint.com/ac-current-sensor-interface-t221239.html on Jun. 10, 2011, 4 pages (pp. 1-4 in pdf).
"Smart Current Signature Sensor" downloaded from http://technology.ksc.nasa.gov/successes/SS-Smart-Current-Signal-Snsr.htm on Jun. 10, 2011, 2 pages (pp. I-2 in pdf).
Dwyer, Daniel, "A Self-Calibrating Miniature Hall Effect Solution to Gear Tooth Speed Sensing", downloaded from: //saba.kntu.ac.ir/eecd/ecourses/instrumentation/projects/reports/speed/toothed%20rotor/toothrotor_files/main.htm on May 25, 2011, 10 pages (pp. 1-10 in pdf).
Valuetesters.com on-line catalog: "non-contact voltage probes", downloaded from http://valuetesters.com/Voltage-Probe-Non-contact.php on May 25, 2011, 5 pages (pp. 1-5 in pdf).

\* cited by examiner

NON-CONTACT CURRENT-SENSING AND VOLTAGE-SENSING CLAMP

The present Application is a Continuation-in-Part (CIP) of U.S. patent application Ser. No. 13/024,181, filed on Feb. 9, 2011 and claims priority thereto under 35 U.S.C. 120. The disclosure of the above-referenced Parent U.S. Patent Application is incorporated herein by reference.

BACKGROUND OF THE INVENTION

1. Field of the Invention

The present invention is related to sensors providing input to power measurement systems, and more specifically to a clamping non-contact sensor that includes an electrostatic voltage sensor and an electromagnetic current sensor that can be used to detect the voltage and current at a wire of a power distribution system.

2. Description of Related Art

A need to measure power consumption in AC line powered systems is increasing due to a focus on energy efficiency for both commercial and residential locations. In order to provide accurate measurements, the characteristics of the load must be taken into account along with the current drawn by the load.

In order to determine current delivered to loads in an AC power distribution system, and in particular in installations already in place, current sensors are needed that provide for easy coupling to the high voltage wiring used to supply the loads, and proper isolation is needed between the power distribution circuits/loads and the measurement circuitry.

It is also necessary to provide a safe environment for electrical workers and other personnel in the vicinity of the installations where power is being measured, because installation may be required in an electrical panel that is operational. Installation of current sensors in a live panel requires the use of insulating gloves that make it difficult to perform fine work with the fingers.

Therefore, it would be desirable to provide a combined voltage and current sensor that can provide isolated current draw information and voltage information so that power can be measured with a single sensor in an AC power distribution circuit. It would further be desirable to provide such a non-contact sensor that is easy to operate while an installer is wearing insulating gloves.

BRIEF SUMMARY OF THE INVENTION

The invention is embodied in a current-sensing and voltage-sensing clamp and method. A current-sensing device including a current sensor and a voltage sensor both integrated in a clamping body that can be detachably coupled to a wire. The sensor thus provides outputs indicative of the current passing through the wire as well as an electric potential on the wire, so that power can be computed.

The clamping body has two handles at a proximal end, which when squeezed, open an aperture containing a current sensor formed from ferrite cylinder portions in which the wire is inserted. When the handles are released, the current sensor closes around the wire to form either a complete ferrite cylinder, or one with a gap along the circumference. A semiconductor magnetic field sensor may be included in the gap and used to measure the current passing through the wire, or a winding may be provided around the ferrite cylinder portion(s). The voltage sensor may be a separate cylindrical plate, another wire or other suitable conductor either offset from the current sensor along the length of the wire, or may be a foil located inside of the ferrite sensor or a film deposited on an inside surface of the ferrite.

The foregoing and other objectives, features, and advantages of the invention will be apparent from the following, more particular, description of the preferred embodiment of the invention, as illustrated in the accompanying drawings.

BRIEF DESCRIPTION OF THE SEVERAL VIEWS OF THE DRAWING

The novel features believed characteristic of the invention are set forth in the appended claims. The invention itself, however, as well as a preferred mode of use, further objectives, and advantages thereof, will best be understood by reference to the following detailed description of the invention when read in conjunction with the accompanying Figures, wherein like reference numerals indicate like components, and:

DETAILED DESCRIPTION OF THE INVENTION

The present invention encompasses a clamping current and voltage sensor and methods of operating such sensors for providing input to power measurement systems. For example, the present invention can provide input to power monitoring equipment in computer server rooms, in which branch circuits distribute power to various electronic chassis power supplies, and in which it is beneficial to provide power usage information for the various branch circuits to power monitoring and/or system control utilities within a computer operating environment. Other applications include power monitoring for commercial and/or residential energy management. The clamping feature makes it possible to attach and detach the sensor with gloved hands, for example while measuring branch circuit power in live electrical panels.

Figure 1:
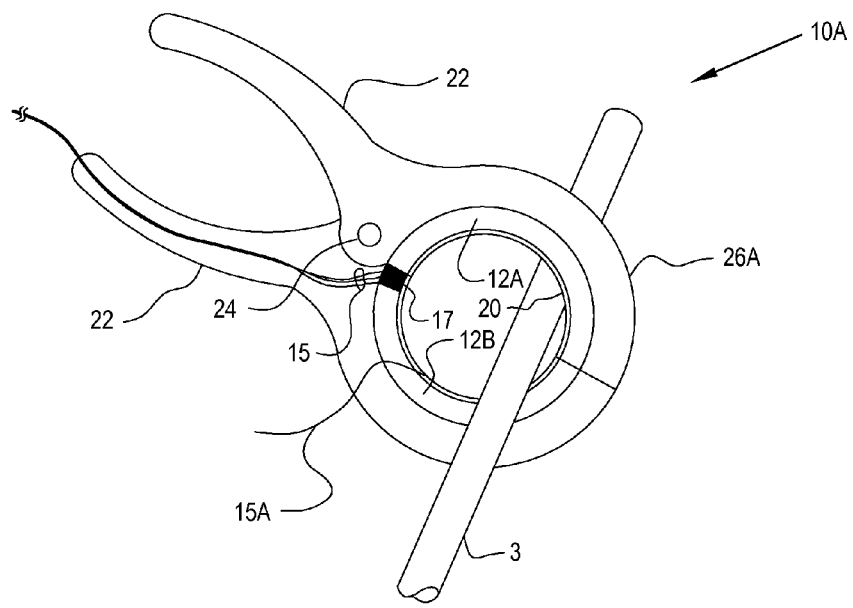
FIG. 1 is a side view of a current and voltage sensor according to an embodiment of the present invention.

Referring now to FIG. 1, a sensor 10A, in accordance with another embodiment of the invention is shown. Sensor 10A includes a clamp body 26A that has two handle portions 22 at a proximal end, and at the distal end defines an aperture in which multiple ferromagnetic cylinder portions 12A, 12B, a current-sensing element 17, and portions of a metallic voltage-sensing element 20 are disposed. Handle portions 22 are joined by a hinge 24 which is spring-loaded. When handle portions 22 are compressed together, the aperture opens, separating ferromagnetic cylinder portions 12A, 12B and voltage-sensing element portions 20 and permitting one or more wires to be introduced to sensor 10A. When handle portions 22 are released, the ends of ferromagnetic cylinder portions 12A, 12B opposite current-sensing element 17 make contact and a side of current-sensing element 17 makes contact with ferromagnetic cylinder portion 12A, closing the magnetic flux sensing loop formed by flexible cylinder portions 12A, 12B and current-sensing element 17. Current-sensing element 17, is generally a magnetic field sensor, such as a Hall effect sensor, current-sensing transformer, anisotropic magnetoresistance (AMR) sensor, ordinary magnetoresistance (CMR) sensor, giant magnetoresistance (GMR) sensor, or other suitable current-sensing device. Current-sensing element 17 is shown as having interface wires 15 extending from its body, but other types of terminals may be used as an alternative manner of providing connections to current-sensing element 17. Current-sensing element 17 provides information about a magnitude and phase of a current passing through a wire 3, which can include multiple wires/conductors, around which flexible ferromagnetic cylinder portions 12A, 12B extend to form a conduction loop for magnetic flux, with a gap defined by current-sensing element 17 which senses the magnetic flux to measure the current passing through wire 3. Sensor 10A additionally includes a voltage-sensing element 20 provided by metal foil segments, which may be plated onto, formed within, or adhered to the inner surface of ferromagnetic cylinder portions 12A, 12B. Voltage-sensing element 20 provides capacitive coupling to branch circuit wire 3 and provides an output via an interface wire 15A, which may also alternatively be replaced with a terminal or other suitable electrical connector. Voltage-sensing element 20 provides an AC waveform that is at least indicative of the phase of the voltage on wire 3, and may be calibrated to provide an indication of the magnitude of the voltage if needed. Interface wires 15A and 15 extend through one of handle portions 22 for connection of measurement electronics, but alternatively the measurement electronics can be integrated within clamp body 26A or handle portions 22. Details of electronic measurement systems and the measurements that can be performed with the sensors disclosed herein are described below with reference to FIG. 4 and FIG. 5.

Figure 2:
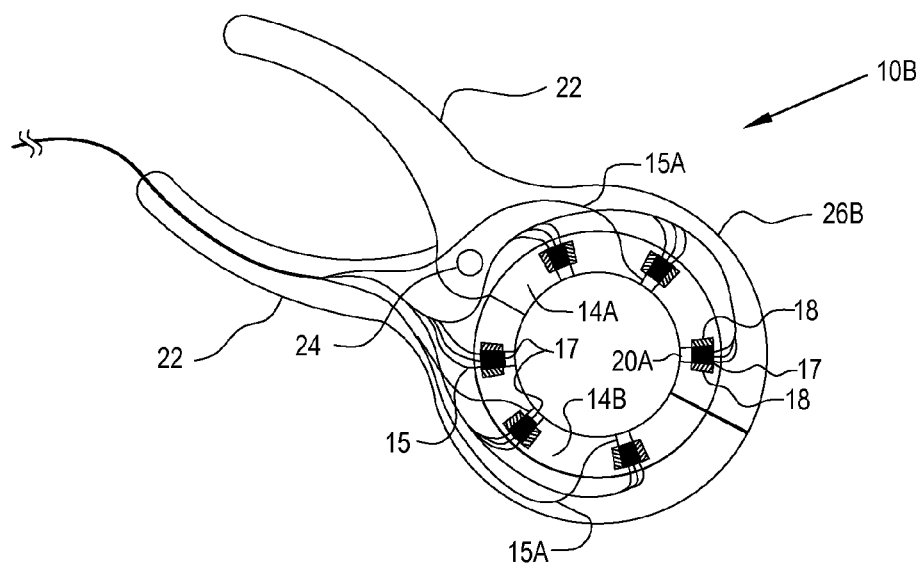
FIG. 2 is a side view of a current and voltage sensor according to another embodiment of the present invention.

Referring now to FIG. 2, details of yet another sensor 10B in accordance with another alternative embodiment of the present invention are shown. Sensor 10B has a clamp body 26B similar to clamp body 26A of sensor 10A of FIG. 1, and incorporates both current and voltage sensors. Therefore, only differences between sensor 10A and 10B are described below. Sensor 10B includes a plurality of high-permeability bodies 18 replacing the ferromagnetic cylinder portions in sensor 10A of FIG. 1, that cause the field around a cable inserted through the opening in housing 14A to be concentrated in the vicinity of semiconductor magnetic field sensors 17. High-permeability bodies 18 thereby improve the signal strength and signal-to-noise ratio (SNR) of the output voltages of sensors 17. In accordance with alternative embodiments of the invention, high-permeability bodies 18 may be located between sensors 17 and the center of the opening formed in housings 14A and 14B, or may be a high-permeability coating deposited on one or more faces of sensors 17. Further, high-permeability bodies 18 may be omitted altogether. The exemplary sensor 10B also includes multiple voltage-sensing elements 20A, which are functionally independent from sensors 17, but may be plated onto, attached as a film, or otherwise disposed on the outer surfaces of sensors 17. Voltage-sensing elements 20A are coupled to measurement electronics by corresponding interface wires 15A, not all of which are shown for clarity. Details of the field generated around multiple conductors and the measurements that are made with multiple sensors are disclosed in U.S. patent application Ser. No. 13/159,554 entitled "MULTI-CONDUCTOR CABLE CURRENT AND VOLTAGE SENSORS", which is incorporated herein by reference. Differing positions of sensors 17 with respect to the conductor(s) inserted in the claim, for example, conductors of a multi-phase power cable, will lead to different resulting current values sensed at the various sensors 17. Similarly, the differing positions of the conductor (s) to the various voltage-sensing elements 20A will yield different values of sensed electric potential.

Figure 3:
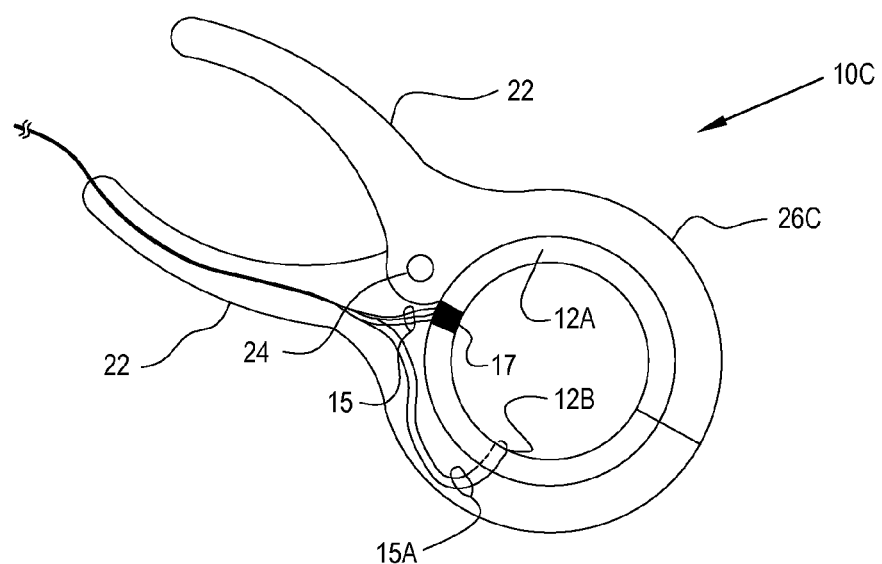
FIG. 3 is a side view of a current and voltage sensor according to another embodiment of the present invention.

Referring now to FIG. 3, details of yet another sensor 10C in accordance with another alternative embodiment of the present invention, is shown. Sensor 10C has a clamp body 26C similar to sensor 10A of FIG. 1, and incorporates both current and voltage sensors. Therefore, only differences between sensor 10A and 10C are described below. Sensor 10C of FIG. 3 includes a conductor 15A that extends through and around ferrite cylinder portion 12B and thereby provides two terminals for connection to the measurement circuit. The loop formed by conductor 15A is used to provide self-calibration of the current and voltage-sensing elements of sensor 10C as will be described in further detail below.

Figure 4:
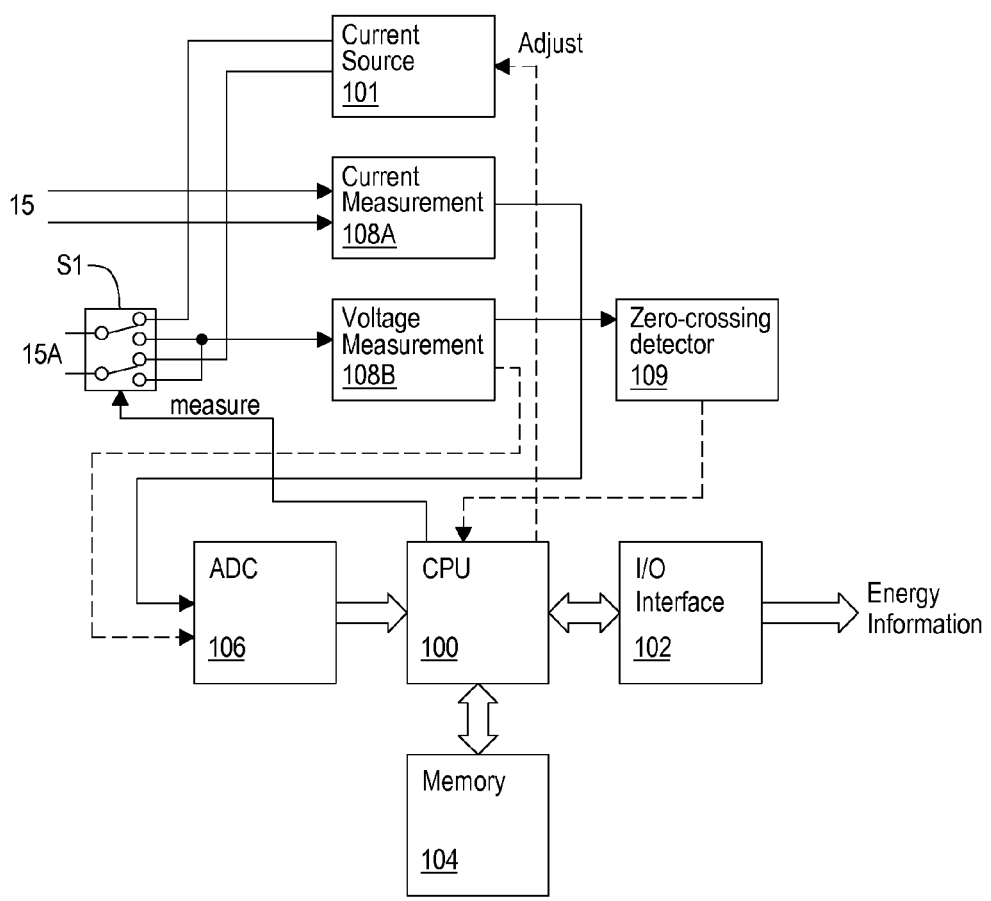
FIG. 4 is an electrical block diagram illustrating a circuit according to an embodiment of the present invention.

Referring now to FIG. 4, a circuit for receiving input from sensor 10A of FIG. 1 and/or sensor 10C of FIG. 3 is shown in a block diagram. All or a portion of the depicted circuit may be integrated within clamp body 26A of sensor 10A/10C, or sensor 10A/10C may be interfaced to the depicted circuit via a multi-conductor cable and connector. Interface wires 15 from current-sensing element 17 provide input to a current measurement circuit 108A, which is an analog circuit that appropriately scales and filters the current channel output of the sensor. The output of current measurement circuit 108A is provided as an input to an analog-to-digital converter (ADC) 106, which converts the current output waveform generated by current measurement circuit 108A to sampled values provided to a central processing unit (CPU) 100 that performs power calculations in accordance with program instruction stored in a memory 104 coupled to CPU 100. Alternatively, current measurement circuit 108A may be omitted and current-sensing element 17 may be connected directly to ADC 106. The power usage by the circuit associated with a particular sensor can be determined by assuming that the circuit voltage is constant (e.g., 115 Vrms for electrical branch circuits in the U.S.) and that the phase relationship between the voltage and current is aligned (i.e., in-phase). However, while the assumption of constant voltage is generally sufficient, as properly designed power distribution systems do not let the line voltage sag more than a small amount, e.g., <3%, the phase relationship between voltage and current is dependent on the power factor of the load, and can vary widely and dynamically by load and over time. Therefore, it is generally desirable to at least know the phase relationship between the branch circuit voltage and current in order to accurately determine power usage by the branch circuit.

Interface wire 15A from the voltage channel of the sensor is provided to a voltage measurement circuit 108B, which is an analog circuit that appropriately scales and filters the voltage channel output of the sensor. If interface wire 15A provides two terminals as in sensor 10C of FIG. 3, then selector S1 may be included to select between a measurement and calibration mode as described below. A zero-crossing detector 109 may be used to provide phase-only information to a central processing unit 100 that performs power calculations, alternatively or in combination with providing an output of voltage measurement circuit 108B to an input of ADC 106. Alternatively, voltage measurement circuit 108B may be omitted and interface wire 15A connected directly to ADC 106. An input/output (I/O) interface 102 provides either a wireless or wired connection to a local or external monitoring system. When power factor is not taken into account, the instantaneous power used by each branch circuit can be computed as:

$$P_{BRANCH} = V_{rms} * I_{meas}$$

where $V_{rms}$ is a constant value, e.g. 115V, and $I_{meas}$ is a measured rms current value. Power value $P_{BRANCH}$ may be integrated over time to yield the energy use. When the phase of the voltage is known, then the power may be computed more accurately as:

$$P_{BRANCH}=V_{rms}*I_{meas}*\cos(\Phi)$$

where $\Phi$ is a difference in phase angle between the voltage and current waveforms. The output of zero-crossing detector 109 may be compared with the position of the zero crossings in the current waveform generated by current measurement circuit 108A and the time $\Delta T$ between the zero crossings in the current and voltage used to generate phase difference $\Phi$ from the line frequency (assuming the line frequency is 60 Hz):

$$\Phi=2\Pi*60*\Delta T$$

In general, the current waveform is not truly sinusoidal and the above approximation may not yield sufficiently accurate results. A more accurate method is to multiply current and voltage samples measured at a sampling rate much higher than the line frequency. The sampled values thus approximate instantaneous values of the current and voltage waveforms and the energy may be computed as:

$$\Sigma(V_n*I_n)$$

A variety of arithmetic methods may be used to determine power, energy and phase relationships from the sampled current and voltage measurements.

If sensor 10C of FIG. 3 is connected to the circuit of FIG. 4, the voltage sensor wires 15A from each end of the voltage-sensing conductor are provided to a selector S1 that is controlled by a control signal measure provided from CPU 100. When control signal measure is asserted, the circuit is in measurement mode, and the voltage sensor wires 15A from each end of sensor 10A are coupled together and provided to the input of voltage measurement circuit 108B. When control signal measure is de-asserted, the circuit is in calibration mode, and voltage sensor wires 15A from each end of sensor 10A are coupled to a current source 101 that generates a predetermined calibration current through voltage sensor wire 15A. Also in calibration mode, a current measurement is made to determine an indication of the magnetic field generated by the current passing through voltage sensor wire 15A as indicated by the output of current measurement circuit 108A, which receives the output of the current sensor. Since the predetermined current level generated by current source 101 is known, the output of current measurement circuit 108A provides a scale factor that can be used to correct subsequent measurements of current by current sensor 10A, e.g., the current passing through wire 3. Current source 101 may be a DC current source, so that CPU 100 can use a low-pass filter or integrator algorithm to remove AC noise from the calibration measurement, or alternatively, current source 101 may be an AC current source and a bandpass filter or algorithm can be used to remove other noise and offset from the measurement. The DC calibration measurement may be performed while the current is being passed through wire 3.

An exemplary set of measurements provide illustration of a calibration technique in accordance with the above-described calibration mode. In calibration mode, if the predetermined current level generated by current source 101 is given by $I_{CAL}$, and the output voltage of current measurement circuit 108A is given by $V_{CAL}$, then, as long as sensor 10C is linear and all of the circuits in FIG. 4 remain linear, the output of current measurement circuit 108A for an unknown current level $I_{UNK}$ is given by:

$$V_{MEAS}=I_{UNK}(V_{CAL}/I_{CAL})$$

Therefore, unknown current level $I_{UNK}$ can be determined from:

$$I_{UNK}=K \cdot V_{MEAS},$$

where calibration value $K=I_{CAL}/V_{CAL}$. Further, if in calibration mode $V_{CAL}$ does not exceed a predetermined threshold, the system can indicate a sensor failure, which may be a connection failure in one of wires 15 or voltage-sensing conductor 15A, or may be a failure of sensor 17 or the measurement circuit. Further, while the above equations assume linear behavior, current source 101 may be an adjustable current source that in a linearity measuring mode is adjusted according to a control value Adjust, which controls the magnitude of the current injected in voltage-sensing conductor 15A when control signal measure is de-asserted. A table of calibration values may be stored and/or coefficients may be determined to form a piecewise linear or other approximation that permits non-linear computation of $I_{UNK}$ from $V_{MEAS}$. A saturation level may be detected for sensor 10A when increases in the adjustable current level commanded by control value Adjust no longer lead to consequent increases in measured voltage level $V_{MEAS}$. For example, operation of the sensing system may be restricted to current levels that have less than a predetermined error due to non-linearity in the sensor, or the measurement range may extend to levels at which correction has high error due to the measured voltage level $V_{MEAS}$ changing by small fractions of the value expected if sensor 10A were linear. Other details of current calibration in voltage/current sensors are described in U.S. patent application Ser. No. 13/159,536 entitled "CALIBRATION OF NON-CONTACT CURRENT SENSORS", the disclosure of which is incorporated herein by reference.

Figure 5:
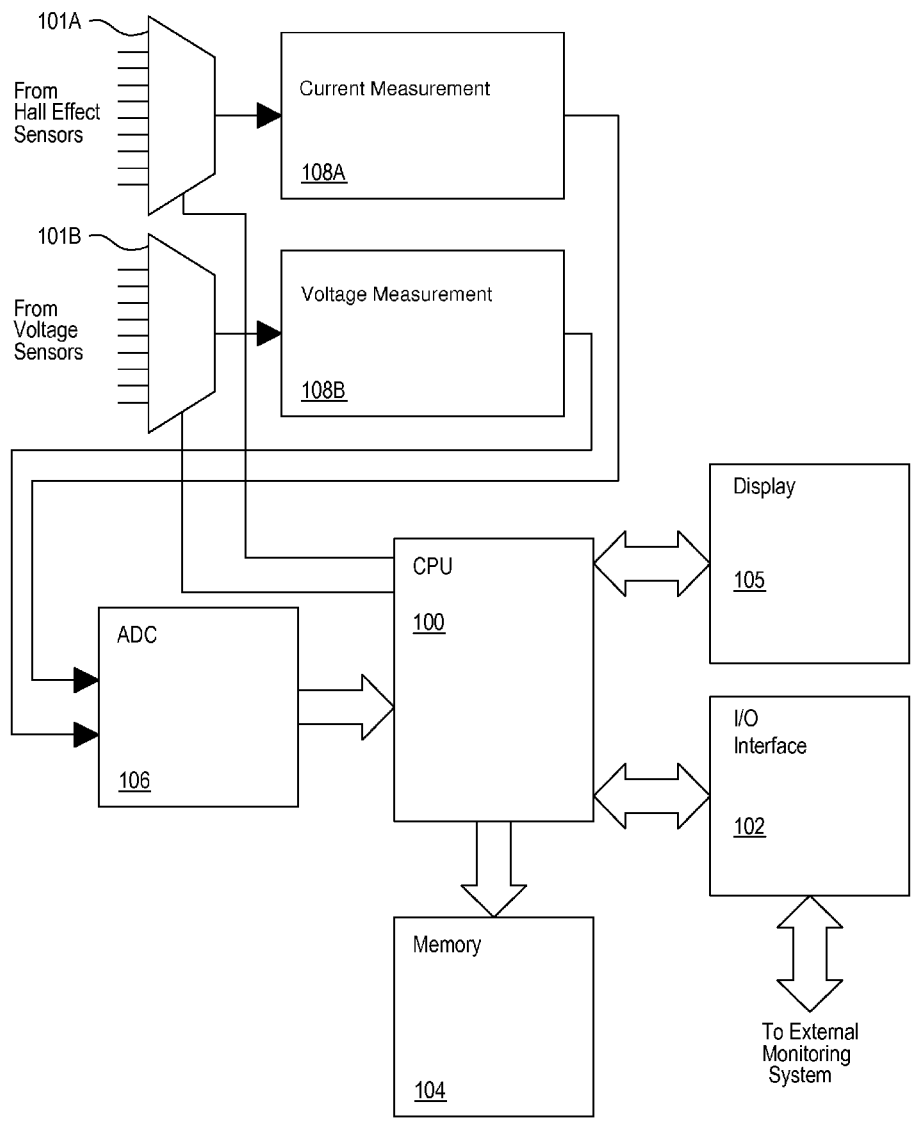
FIG. 5 is an electrical block diagram illustrating a circuit according to another embodiment of the present invention.

Referring now to FIG. 5, a system in accordance with another embodiment of the present invention is shown, and which is suitable for use with sensor 10B of FIG. 2. A multiplexer 101A receives signals from the individual magnetic field sensors 16 and selects a sensor for measurement, providing input to a current measurement circuit 108A, which is an analog circuit that appropriately scales and filters the output of sensors 16. The output of current measurement circuit 108A is provided as an input to an analog-to-digital converter (ADC) 106, which converts the output waveforms generated by current measurement circuit 108A to sampled values provided to a central processing unit (CPU) 100 that performs calculations in accordance with program instructions stored in a memory 104 coupled to CPU 100. Alternatively, a separate magnetic field measurement circuit 108A and multiplexer 101A may not be necessary, and sensors 16 may be coupled directly to ADC 106. Similarly, multiplexer 101B receives signals from voltage sensing elements 20A and selects a voltage-sensing element for measurement, providing input to a voltage measurement circuit 108B, which is an analog circuit that appropriately scales and filters the output of voltage sensing elements 20A. The output of voltage measurement circuit 108B is provided as an input to an analog-to-digital converter (ADC) 106, which converts the output waveforms generated by voltage measurement circuit 108B to sampled values provided to a central processing unit (CPU) 100. An input/output (I/O) interface 102 provides either a wireless or wired connection to an external monitoring system, such as a wireless local area network (WLAN) connection or wired Ethernet connection. An integrated display 105 may be additionally or alternatively provided to indicate a direct measure of current in a conductor. CPU 100 can perform computations to discover and map the phases of conductors in a cable, as the invention is not limited to 2-phase systems such as that depicted in above-incorporated U.S.

Patent Application "MULTI-CONDUCTOR CABLE CURRENT AND VOLTAGE SENSORS." Further, cable configurations such as multiple conductors corresponding to a single return conductor may be measured and a net current magnitude value determined.

While the invention has been particularly shown and described with reference to the preferred embodiments thereof, it will be understood by those skilled in the art that the foregoing and other changes in form, and details may be made therein without departing from the spirit and scope of the invention.

What is claimed is:

1. A sensor for sensing an electric potential on a wire of a power distribution system and a current passing through the wire, the sensor comprising:
    a sensor clamp body including a pair of handles disposed at a proximal end thereof and a hinge mechanism coupling the pair of handles, so that compressing the pair of handles opens an aperture at a distal end of the sensor clamp body for receiving the wire, and wherein the hinge mechanism includes a restoring spring to close the aperture around the wire when the pair of handles is released;
    a current-sensing device disposed within the sensor clamp body for providing a first output indicative of the current passing through the wire;
    a voltage-sensing device integrated in the sensor clamp body for providing a second output indicative of the electric potential on the wire, wherein the voltage-sensing device and the current-sensing device do not make electrical contact with the wire, wherein the voltage-sensing device has a first terminal for providing the second output and a second terminal; and
    a selector circuit coupled to the voltage-sensing device for selecting between a measurement mode and a calibration mode, wherein in the calibration mode, the selector circuit couples the first terminal and the second terminal of the voltage-sensing device to a current source that causes a calibration current of predetermined magnitude to be conducted through the voltage-sensing device and to a current-measuring circuit that measures the first output of the current-sensing device to obtain a current measurement calibration value when the selector circuit selects the calibration mode, and wherein when the selector circuit selects the measurement mode, the current-measuring circuit adjusts a value of the first output in conformity with the current measurement calibration value.

2. The sensor of claim 1, wherein the voltage-sensing device comprises at least one metal cylinder portion disposed within the aperture and through which the wire is disposed when the sensor is coupled to the wire, wherein the second output is an electrical connection to the at least one metal cylinder portion, whereby the wire is capacitively coupled to the second output.

3. The sensor of claim 1, wherein the voltage-sensing device comprises a second wire inserted into the aperture, wherein the second output is an electrical connection to the second wire.

4. The sensor of claim 1, wherein the current-sensing device comprises:
    at least two ferrite cylinder portions disposed within the aperture, wherein when the sensor clamp is closed around the wire, the wire passes through a central void defined by the ferrite cylinder portions extending through a central axis thereof, and wherein a gap is defined along a circumference of a cylinder formed by the ferrite cylinder portions; and
    a semiconductor magnetic field sensor disposed within the gap, wherein the second output is a voltage output of the semiconductor magnetic field sensor.

5. The sensor of claim 4, wherein the voltage-sensing device comprises at least one metal cylinder portion disposed within the central void and through which the wire is disposed when the sensor clamp is closed around the wire, wherein the second output is an electrical connection to the at least one metal cylinder portion, whereby the wire is capacitively coupled to the second output.

6. The sensor of claim 5, wherein the at least one metal cylinder portion is a metal layer deposited on or affixed to at least one of the ferrite cylinder portions.

7. The sensor of claim 1, wherein the voltage-sensing device comprises a second wire inserted into the aperture, wherein the second output is an electrical connection to the second wire.

8. The sensor of claim 1, wherein the wire is a wire of a multi-conductor cable, and wherein the sensor further comprises:
    a plurality of semiconductor magnetic field sensors integrated in the clamp body and disposed circumferentially around the aperture, whereby at least some of the semiconductor magnetic field sensors are located at differing positions with respect to the conductors of the multi-conductor cable including the wire when the clamp body is closed around the multi-conductor cable, wherein individual ones of the plurality of semiconductor magnetic field sensors provide corresponding outputs indicative of the properties of currents in conductors of the multi-conductor that further differ due to the differing positions.

9. A sensor for sensing an electric potential on a wire of a power distribution system and a current passing through the wire, the sensor comprising:
    a sensor clamp body including a pair of handles disposed at a proximal end thereof and a hinge mechanism coupling the pair of handles, so that compressing the pair of handles opens an aperture at a distal end of the sensor clamp body for receiving the wire, and wherein the hinge mechanism includes a restoring spring to close the aperture around the wire when the pair of handles is released;
    a current-sensing device disposed within the aperture and comprising at least one ferrite cylinder portion disposed within the aperture and a semiconductor magnetic field sensor disposed within a gap formed between ends of the at least one ferrite cylinder portion;
    a voltage-sensing device integrated in the sensor clamp body and comprising a metal layer deposited on or affixed to at least one of the ferrite cylinder portions, wherein the voltage-sensing device has a first terminal for providing the second output and a second terminal; and
    a selector circuit coupled to the voltage-sensing device for selecting between a measurement mode and a calibration mode, wherein in the calibration mode, the selector circuit couples the first terminal and the second terminal of the voltage-sensing device to a current source that causes a calibration current of predetermined magnitude to be conducted through the voltage-sensing device and to a current-measuring circuit that measures the first output of the current-sensing device to obtain a current measurement calibration value when the selector circuit selects the calibration mode, and wherein when the selector circuit selects the measurement mode, the current-measuring circuit adjusts a value of the first output in conformity with the current measurement calibration value.

10. The sensor of claim 9, wherein the wire is a wire of a multi-conductor cable, and wherein the sensor further comprises:

a plurality of semiconductor magnetic field sensors integrated in the clamp body and disposed circumferentially around the aperture, whereby at least some of the semiconductor magnetic field sensors are located at differing positions with respect to conductors of the multi-conductor cable including the wire when the clamp body is closed around the multi-conductor cable, wherein individual ones of the plurality of semiconductor magnetic field sensors provide corresponding outputs indicative of the properties of currents in conductors of the multi-conductor that further differ due to the differing positions.

11. A method for sensing an electric potential on a wire of a power distribution system and a current passing through the wire, the sensor comprising:

securing a clamp body of a sensor around the wire by compressing and releasing a pair of handles disposed at a proximal end of the clamp body to open and close an aperture formed at a distal end of the sensor clamp body, wherein the aperture receives the wire;

generating a first indication of the current passing through the wire by measuring a magnitude of magnetic flux through the aperture by a current-sensing device disposed within the clamp body;

generating a second indication of the electric potential of the wire by electrostatically coupling the wire to a voltage-sensing device disposed within the aperture proximate the wire;

selecting between a calibration mode and a measurement mode in a circuit connected to the current-sensing device;

responsive to selecting the measurement mode, first measuring a first magnitude of a first magnetic field generated by current conducted in the wire using an output of the current-sensing device;

responsive to selecting the measurement mode, second measuring at least one of a second magnitude or phase of an electrostatic field generated by the wire by measuring a voltage of the voltage-sensing device;

responsive to selecting the calibration mode, conducting a calibration current of predetermined magnitude through the voltage-sensing device and third measuring a second magnitude of a second magnetic field generated by the predetermined current in the voltage-sensing device using the output of the sensing element to obtain a current measurement calibration value; and correcting a result of the first measuring in conformity with the current measurement calibration value.

12. The method of claim 11, wherein the generating the second indication comprises measuring an electrostatic potential on a second wire inserted into the aperture.

13. The method of claim 11, wherein the generating the first indication of the current passing through the wire comprises measuring the magnitude of magnetic flux in a ferrite cylinder disposed around the wire and secured within the clamp body, wherein the ferrite cylinder is opened when the handles are compressed and closed when the handles are released.

14. The method of claim 13, further comprising forming the ferrite cylinder around the wire by providing multiple cylindrical ferrite portions within the clamp body, whereby the securing places the multiple cylindrical ferrite portions together to form the ferrite cylinder.

15. The method of claim 13, wherein the generating the first indication of the current passing through the wire comprises:

concentrating the magnetic flux in a gap formed by the portions of the ferrite cylinder such that the portions do not complete a circumference of the ferrite cylinder around the wire; and generating an output voltage or current from a semiconductor magnetic field sensor disposed within the gap.

16. The method of claim 13, wherein the generating the second indication comprises measuring an electrostatic potential on a metal layer deposited on or affixed to at least one of the portions of ferrite cylinder.

17. The method of claim 11, wherein the generating the second indication comprises measuring an electrostatic potential on a metal layer deposited on or affixed to the ferrite cylinder.

* * * * *